United States Patent
Hu et al.

(10) Patent No.: US 9,252,339 B2
(45) Date of Patent: Feb. 2, 2016

(54) RED LIGHT-EMITTING NITRIDE MATERIAL, AND LIGHT-EMITTING PART AND LIGHT-EMITTING DEVICE COMPRISING THE SAME

(75) Inventors: Yunsheng Hu, Beijing (CN); Tao He, Beijing (CN); Huaqiang He, Beijing (CN); Weidong Zhuang, Beijing (CN); Ronghui Liu, Beijing (CN); Yuanhong Liu, Beijing (CN); Nan Li, Beijing (CN)

(73) Assignee: GRIREM ADVANCED MATERIALS CO., LTD. (CN)

( * ) Notice: Subject to any disclaimer, the term of this patent is extended or adjusted under 35 U.S.C. 154(b) by 0 days.

(21) Appl. No.: 14/349,703

(22) PCT Filed: Oct. 17, 2011

(86) PCT No.: PCT/CN2011/080866
§ 371 (c)(1),
(2), (4) Date: Apr. 4, 2014

(87) PCT Pub. No.: WO2013/056408
PCT Pub. Date: Apr. 25, 2013

(65) Prior Publication Data
US 2014/0239800 A1    Aug. 28, 2014

(51) Int. Cl.
| | |
|---|---|
| *H01J 1/62* | (2006.01) |
| *H01J 63/04* | (2006.01) |
| *H01L 33/50* | (2010.01) |
| *C09K 11/02* | (2006.01) |
| *C09K 11/77* | (2006.01) |
| *F21K 99/00* | (2010.01) |
| *C04B 35/597* | (2006.01) |

(52) U.S. Cl.
CPC ............ *H01L 33/502* (2013.01); *C04B 35/597* (2013.01); *C09K 11/02* (2013.01); *C09K 11/7783* (2013.01); *C09K 11/7792* (2013.01); *F21K 9/56* (2013.01); *C04B 2235/3206* (2013.01); *C04B 2235/3208* (2013.01); *C04B 2235/3213* (2013.01); *C04B 2235/3215* (2013.01); *C04B 2235/3224* (2013.01); *C04B 2235/3225* (2013.01); *C04B 2235/3227* (2013.01); *C04B 2235/3284* (2013.01); *C04B 2235/3409* (2013.01)

(58) Field of Classification Search
CPC ............. C09K 11/025; C09K 11/7792; C09K 11/7783; C09K 11/02; F21K 9/56; H01L 33/502

USPC ............... 313/503, 502; 257/98; 252/301.4 F, 252/301.6 F
See application file for complete search history.

(56) References Cited

U.S. PATENT DOCUMENTS

| | | | | |
|---|---|---|---|---|
| 2006/0255710 | A1* | 11/2006 | Mueller-Mach et al. | ..... 313/485 |
| 2008/0149956 | A1* | 6/2008 | Mueller-Mach et al. | ........ 257/98 |
| 2009/0134775 | A1* | 5/2009 | Watanabe | ............. C04B 35/581 313/503 |
| 2009/0174309 | A1* | 7/2009 | Schmidt et al. | ................ 313/503 |
| 2010/0187974 | A1 | 7/2010 | Zhang | |
| 2012/0286647 | A1* | 11/2012 | Schmidt et al. | ............... 313/503 |

FOREIGN PATENT DOCUMENTS

| | | |
|---|---|---|
| CN | 101157854 | 4/2008 |
| CN | 101473459 | 7/2009 |
| EP | 1104799 | 6/2001 |
| JP | 200663214 | 3/2006 |
| JP | 2009500822 A | 1/2009 |
| JP | 2009132916 A | 6/2009 |
| WO | 2006087661 A1 | 8/2006 |
| WO | 2011095915 A1 | 8/2011 |

OTHER PUBLICATIONS

International Search Report for corresponding application PCT/CN2011/080866 filed Oct. 17, 2011; Mail date Jun. 14, 2014.
European Search Report for corresponding application No. 11 87 4429; Reported dated Jun. 1, 2015.

* cited by examiner

*Primary Examiner* — Bao Q Truong
*Assistant Examiner* — Glenn Zimmerman
(74) *Attorney, Agent, or Firm* — Cantor Colburn LLP

(57) ABSTRACT

Disclosed are a red light-emitting nitride material, a light-emitting part and a light-emitting device comprising the same. The General Formula of the light-emitting material is: $M_a(Al,B)_b Si_c N_d O_e:Eu_m, R_n$, wherein M is at least one of the alkaline earth metal elements Mg, Ca, Sr, Ba and Zn; R is at least one of the rare earth elements Y, La, Ce, Gd and Lu; and $0.9 \le a < 1.1$, $0.9 \le b \le 1$, $1 \le c \le 1.5$, $2.5 < d < 5$, $0 < e < 0.1$, $0 < m < 0.05$, $0 < n < 0.1$ and $1 < c/b < 1.5$. The light-emitting material can be effectively excited by a radiation light having a wavelength below 500 nm, and then emits a visible red light having a wide spectrum from 500 nm to 780 nm. The light-emitting material of the present disclosure has the characteristics of high light-emitting efficiency, good temperature properties and a wide half-width etc., and the material can be used alone or in combination with other light-emitting materials for making high performance light-emitting devices.

19 Claims, 1 Drawing Sheet

US 9,252,339 B2

Figure 1:
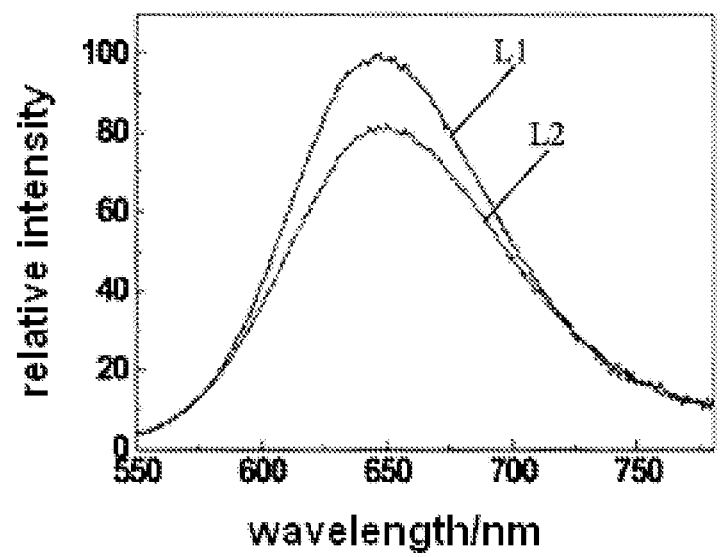

RED LIGHT-EMITTING NITRIDE MATERIAL, AND LIGHT-EMITTING PART AND LIGHT-EMITTING DEVICE COMPRISING THE SAME

TECHNICAL FIELD

The present disclosure belongs to the technical field of light-emitting materials, and particularly relating to a red light-emitting nitride material, a light-emitting part and a light-emitting device comprising the same.

BACKGROUND

A red light-emitting material is indispensable as an important component of the three primary colours, red, green and blue. Red light-emitting materials broadly applied at present include $Y_2O_3:Eu^{3+}(Bi^{3+})$, $Y_2O_2S:Eu^{3+}(Bi^{3+})$, $Y(V,P)O_4:Eu^{3+}(Bi^{3+})$, $(Y,Gd)BO_3:Eu^{3+}$ and $(Ca,Sr)S:Eu^{2+}(Tm^{3+})$ etc. However, as traditional technologies, including display and illumination etc., have been changed, these traditional red light-emitting materials, which used to be radiant, fail to well meet the needs of the development of new technologies, including three-dimensional (3D) display and white Light-Emitting Diodes (LED) etc., because of changes in application fields and excitation modes.

Since the late 1990s, a category of novel nitrogen/nitrogen oxide light-emitting materials have been developed. Anionic groups of the light-emitting materials of this category contain high negative charge $N^{3-}$, and excitation spectra of the light-emitting materials move towards longer wavelengths including near ultraviolet and visible light etc. because of the expansion effect of electronic cloud. In addition, substrates of the light-emitting materials are provided with relatively dense network structures having stable physicochemical properties.

A kind of $M_xSi_yN_z:Eu$ (M is at least one of Ca/Sr/Ba, and $z=2/3x+4/3y$) red light-emitting nitride material was disclosed in a patent document EP1104799A1 in 2001, and representative red light-emitting materials mainly include three materials, i.e. $MSiN_2:Eu$, $M_2Si_5N_8:Eu$ and $MSi_7N_{10}:Eu$, and the like. It is reported in a non-patent document Chem. Mater. 2006, 18: 5578 that the light-emitting intensity of this kind of $Sr_2Si_5N_8:Eu$ red light-emitting nitride material at 150□ is only 86% of that at room temperature.

A kind of $M_aA_bD_cE_dX_e$ red light-emitting material is invented in a Chinese disclosure patent ZL 200480040967.7. In the formula, a+b=1, and M is one or two elements of Mn/Ce/Pr/Nd/Sm/Eu/Tb/Dy/Ho/Er/Tm/Yb, A is one or two elements of Mg/Ca/Sr/Ba, D is one or two elements of Si/Ge/Sn/Ti/Zr/Hf, E is one or two elements of B/Al/Ga/In/Sc/Y/La/Ga/Lu, and X is selected from one or two elements of O, N and F. The inorganic compound has the same crystal structure as that of $CaAlSiN_3$, and $0.00001 \le a \le 0.1$, $0.5 \le c \le 4$, $0.5 \le d \le 8$, $0.8*(2/3+4/3*c+d) \le e$ and $e \le 1.2(2/3+4/3*c+d)$, wherein a typical composition is $CaAlSiN_3:Eu$. It is reported in a non-patent document Sci. Technol. Adv. Mat., 2007, 8(7-8): 588-600 that the light-emitting intensity of this kind of $CaAlSiN_3$ light-emitting material at 150□ is 89% of that at room temperature, which is higher than that of the $Sr_2Si_5N_8:Eu$ light-emitting material.

A certain amount of Aluminium Nitride (AlN) was introduced based on $CaSiN_2:Eu$ in a non-patent document (Int. J. Appl. Ceram. Technol., 2010, 7(6):787-802) in 2009 to obtain $Ca1-xAlzSiN_2+z:Eu_x$ ($0<z<0.3$). However, with the introduction of AlN, the light-emitting efficiency of the material is reduced significantly. The external quantum efficiencies of the material excited at 405 nm and 450 nm are only 28.5% and 24.5%, respectively. In addition, it is reported by the document that, $Ca_{0.999}SiN_2:Eu_{0.001}$, with a relatively low thermal quenching temperature at about 110□, has bad temperature properties.

The red fluorescent powder involved in the documents above has better temperature properties than those of traditional red sulfide fluorescent powder $((Ca,Sr)S:Eu^{2+})$. At the same time, it can be easily learned that the light-emitting intensities of the red light-emitting materials involved in the documents above at 150□ are all lower than 90% of those at room temperature, which remains to be improved. In addition, red light-emitting materials applied in devices to efficiently improve colour rendering indexes are required to have wide half widths while the light-emitting half widths of the light-emitting materials above are generally about 90 nm which is required to be further widened. In addition, although a high colour rendering index can be obtained by a technical solution which improves the colour rendering index by adding a red light-emitting material, the overall light-emitting efficiency of a device is greatly reduced at the same time, which needs to be alleviated by further improving the light-emitting efficiency of the red light-emitting material.

SUMMARY

A purpose of the present disclosure is to provide a red light-emitting nitride material with high light-emitting efficiency, good temperature properties and a wide half-width.

Another purpose of the present disclosure is to provide a light-emitting device applying the red light-emitting nitride material.

Therefore, the present disclosure provides a red light-emitting nitride material. The red light-emitting nitride material is provided with the structure in General Formula (1). General Formula (1) is $M_a(Al,B)_bSi_cN_dO_e:Eu_m, R_n$, wherein M is at least one of Mg, Ca, Sr, Ba and Zn; R is at least one of earth metal elements Y, La, Ce, Gd and Lu; and the molar ratio x of elements B and Al satisfies $0 \le x \le 0.1$, and $0.9 \le a < 1.1$, $0.9 \le b \le 1$, $1 \le c \le 1.5$, $2.5 < d < 5$, $0 < e < 0.1$, $0 < m < 0.05$, $0 < n < 0.1$ and $1 < c/b < 1.5$.

Further, M at least contains Ca and/or Sr.

Further, R at least contains earth metal element Y and/or Gd.

Further, R is earth metal element Y.

Further, the range of n is $0.001 \le n \le 0.05$.

Further the range of m is $0.005 \le m \le 0.025$.

Further, the light-emitting material is any one of the following materials:

$Ca_{0.99}Al_{0.9}B_{0.009}Si_{1.1}N_{3.8}O_{0.002}:Eu_{0.01},Y_{0.001}$;

$Ca_{0.2}Sr_{0.89}Al_{0.99}SiN_3O_{0.001}:Eu_{0.008},Y_{0.001},La_{0.001}$;

$Ca_{0.75}Sr_{0.22}Al_{0.92}B_{0.07}Si_{1.2}N_4O_{0.015}:Eu_{0.025},Y_{0.02},Gd_{0.005},Lu_{0.005}$;

$Ca_{0.45}Sr_{0.45}Zn_{0.02}Al_{0.9}Si_{1.48}N_4O_{0.05}:Eu_{0.04},Y_{0.015},Lu_{0.005}$;

$Sr_{1.05}Al_{0.9}B_{0.09}Si_{1.3}N_{3.5}O_{0.0005}:EU_{0.005},Y_{0.008}$;

$Ca_{0.675}Sr_{0.3}Al_{0.9}SiN_{2.6}O_{0.005}:Eu_{0.02},Gd_{0.003},La_{0.002}$;

$Sr_{1.05}Al_{0.9}B_{0.09}Si_{1.3}N_{3.5}O_{0.0005}:Eu_{0.005},Y_{0.05}$;

$Sr_{1.05}Al_{0.9}B_{0.09}Si_{1.3}N_{3.5}O_{0.0005}:Eu_{0.005},Y_{0.0008}$;

$Sr_{1.05}Al_{0.9}B_{0.09}Si_{1.3}N_{3.5}O_{0.0005}:Eu_{0.005},Y_{0.095}$; or $Ca_{0.2}Sr_{0.89}Al_{0.99}SiN_3O_{0.001}:Eu_{0.005},Y_{0.001},La_{0.001}$.

Further, the light-emitting material is powder-shaped, or film-shaped or sheet-shaped.

At the same time, the present disclosure further provides a light-emitting part. The light-emitting part is formed by dispersing the red light-emitting nitride material in a glass material, a plastic material or a resin material, or dispersing the red light-emitting nitride material and other light-emitting materials together in the glass material, the plastic material or the resin material.

Further, the other light-emitting materials are one or more of the following fluorescent powder:

$(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, α-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu,Cl/Al, ZnS:Ag,Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu,and $3.5MgO·_{0.5}MgF_2·GeO_2$:Mn.

At the same time, the present disclosure further provides a light-emitting device. The light-emitting device at least includes a radiation source and the red light-emitting nitride material.

Further, the radiation source is a vacuum ultraviolet emission source, an ultraviolet emission source, a purple light emission source or a blue light emission source.

Further, the light-emitting device further contains other light-emitting materials excited by the radiation source to emit lights.

Further, the other light-emitting materials are one or more of the following fluorescent powder:

$(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, α-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu,Cl/Al, ZnS:Ag,Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu, and $3.5MgO·_{0.5}MgF_2·GeO_2$:Mn.

The present disclosure has the following beneficial effect: the red light-emitting nitride material provided by the present disclosure has high light-emitting efficiency, good temperature properties and a wide half-width. At the same time, the luminance of the light-emitting device prepared by the red light-emitting nitride material is improved obviously.

Besides the purposes, features and advantages described above, the present disclosure also has other purposes, features and advantages. The present disclosure will be further described in details below with reference to drawings.

BRIEF DESCRIPTION

Figure 2:
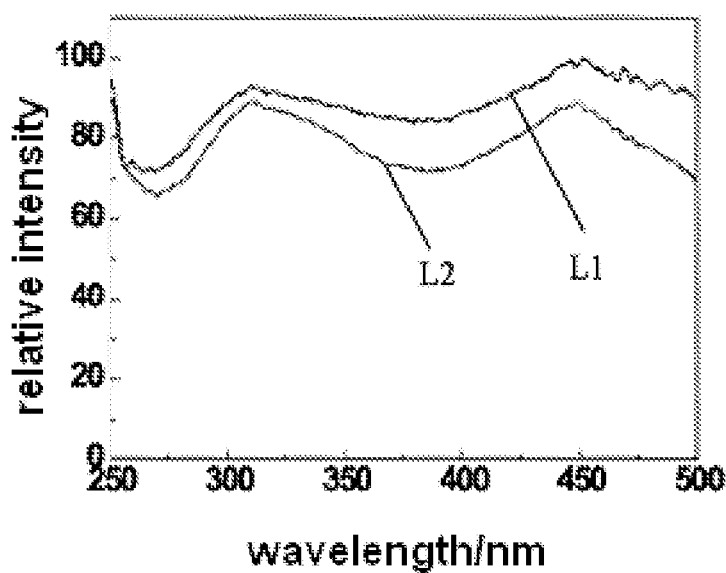

The accompanying drawings, which constitute a part of the specification and are provided for further understanding of the present disclosure, show the preferred embodiments of the present disclosure, and explain the principle of the present disclosure together with the specification. In the drawings:

FIG. 1 shows a diagram illustrating comparison between an emission spectrum of a light-emitting material prepared in the embodiment 1 and an emission spectrum of a light-emitting material prepared in a comparative example of the present disclosure; and FIG. 2 shows a diagram illustrating comparison between an excitation spectrum of a light-emitting material prepared in the embodiment 1 and an excitation spectrum of a light-emitting material prepared in a comparative example of the present disclosure.

DETAILED DESCRIPTION

It should be noted that, the following detailed descriptions are exemplary, aiming to provide further description for the present disclosure. Unless defined otherwise, all technical and scientific terms used herein have the same meaning as those commonly understood to one of ordinary skill in the art to which the present disclosure belongs.

In a typical embodiment of the present disclosure, a red light-emitting nitride material contains a divalent metal M, a rare earth element Eu (europium), and R, Al (aluminum), silicon (Si), N (nitrogen) and oxygen (O) at the same time, and is provided with the structure of General Formula (1) which is $M_a(Al,B)_bSi_cN_dO_e:Eu_m,R_n$, wherein M is at least one of Mg, Ca, Sr, Ba and Zn; R is at least one of earth metal elements Y, La, Ce, Gd and Lu; and the molar ratio x of elements B and Al satisfies $0 \leq x \leq 0.1$, and wherein $0.9 \leq a < 1.1$, $0.9 \leq b \leq 1$, $1 \leq c \leq 1.5$, $2.5 < d < 5$, $0 < e < 0.1$, $0 < m < 0.05$, $0 < n < 0.1$ and $1 < c/b < 1.5$.

The structure of the light-emitting material is constructed based on a $SiN_4$ tetrahedron with $Eu^{2+}$ as a light-emitting center. A (Al,B) component that easily tends to a network structure is introduced into the light-emitting material, and a small amount of rare earth element R (including Y, La, Ce, Gd and Lu) is applied for purposes of position supplement and space-filling. At the same time, in order to maintain the tetrahedron structure of the light-emitting material without causing great lattice distortion, the addition amount b of (Al,B) is close to the addition amount a of the divalent metal element M, wherein the range of a is $0.9 \leq a < 1.1$, the range of b is $0.9 \leq b \leq 1$, and the proportion of b to Si satisfies $1 < c/b < 1.5$. The synergistic effect can make the structure of the light-emitting material more stable and compact, thus further improving the temperature properties of the light-emitting material.

At the same time, the addition of Al and B also realizes other significant effect. For example, element B (boron) is very helpful for enhancement of calcination because of its low melting point and activity, thus further improving the particle crystallinity of the light-emitting material so that the light-emitting material has high light-emitting efficiency, good temperature properties and small luminous decay. B (boron) should be introduced in an appropriate amount and the molar ratio x of B (boron) and Al (aluminum) should be in the range of $0 \leq x \leq 0.1$. On the contrary, lattice distortion may be caused because of a big difference between the radius of B (boron) and that of Al (aluminum) if the ratio is beyond this range, which is unfavorable for the light-emitting efficiency and service life of the light-emitting material.

In the light-emitting material, rare earth element R (including Y, La, Ce, Gd and Lu) are co-doped, which is beneficial to enhancing the absorption of the radiation energy of the light-emitting material on excitation light. In addition, the absorbed energy can be transferred to the light-emitting center Eu to improve the brightness without competitive absorption or reabsorption of the light-emitting center, thus ensuring high light-emitting efficiency of the material. The introduction of rare earth element R (including Y, La, Ce, Gd and Lu) also enhances the calcination of the light-emitting material, and works jointly with the added B (boron) to improve the particle crystallinity, enhance the light-emitting efficiency, and reduce the luminous decay and thermal quenching of the light-emitting material. Similarly, rare earth element R (including Y, La, Ce, Gd and Lu) is also added in an appropriate amount n: 0<n<0.1. Too much addition will cause an impurity phase that apparently fails to emit light, which reduces the brightness.

In order to meet the application requirement of high colour rendering, an appropriate amount of O (oxygen) is further introduced based on the components above to widen the half width of the emission spectrum of the material. When the introduction amount e of oxygen is in the range of $0<e<0.1$, the half width of the light-emitting spectrum of the light-emitting material can be adjusted between 95 nm and 130 nm, which is wider than the half width of about 90 nm of existing red light-emitting materials including $M_xSi_yN_z$:Eu and (Ca, Sr)AlSiN$_3$:Eu etc. while maintaining higher light efficiency. However, when the addition amount e of oxygen is larger than 0.1, the brightness of the red light-emitting material is greatly reduced on the contrary because oxygen is compounded with (Al,B), Si and rare earth etc. in the structure more easily to change the structure and the crystal field.

In the light-emitting material of the present disclosure, $Eu^{2+}$, which is the light-emitting center, can be effectively excited by a radiation light having a wavelength below 500 nm to emit a visible red light having a wide spectrum from 500 nm to 780 nm.

At the same time, in order to satisfy application requirements of different light-emitting devices on photochromic properties etc. of the light-emitting material, the light-emitting material of the present disclosure comprehensively applies ways including adjustment of the varieties and proportions of divalent elements Mg, Ca, Sr, Ba and Zn represented by M in the General Formula of the light-emitting material, and the concentration of the activator Eu etc. to realize controllable adjustment of the main emission peak and spectrum coverage area of the light-emitting material. For example, the main emission peak of the material has a gradual redshift and the light-emitting colour turns redder with the increase in the Sr content and the decrease in the Ca content. The concentration of the activator Eu is increased, along with an increase in light-emitting center, the main emission peak also has a redshift and the light-emitting intensity is enhanced simultaneously. However, a concentration quenching effect will occur during light emission of the material when the concentration of Eu is higher than 0.025. At the moment, the light-emitting intensity of the light-emitting material will be reduced on the contrary even if the Eu concentration is increased continuously. In addition, when the Eu concentration is increased to larger than 0.05, the concentration quenching effect will be very serious, and the brightness of the material will be decreased significantly. When the content a of the divalent element M component is in the range of $0.9 \leq a < 1.1$ and the concentration m of Eu satisfies $0<m<0.05$, the emission spectrum of this kind of light-emitting material can be adjusted controllably within a visible band from 500 nm to 780 nm. By reading the application documents of the present disclosure, those skilled in the art may be taught by the application documents of the present disclosure to use conventional technical means reasonably to realize controllable adjustment of the emission spectrum of this kind of light-emitting material within the visible band from 500 nm to 780 nm, which will not be repeated here.

Preferably, in the red light-emitting nitride material, M at least contains Ca and/or Sr. When M at least includes one or two of Ca and Sr, the light-emitting material has high brightness and good temperature properties in the condition of obtaining the same chroma.

Preferably, R in the red light-emitting nitride material at least contains rare earth element Y and/or Gd. When R at least contains on or two of rare earth elements Y and Gd, the light-emitting material has high brightness and good temperature properties in the condition of obtaining the same chroma. More preferably, R is rare earth element Y.

Preferably, the addition amount n of R in the red light-emitting nitride material is in the range of $0.001 \leq n \leq 0.05$, within which the light-emitting material has high brightness and good temperature properties.

Preferably, the addition amount m of Eu in the red light-emitting nitride material is in the range of $0.005 \leq m < 0.025$, within which the light-emitting material has high brightness and good temperature properties. This is because, when the addition amount of Eu is smaller than 0.005, too little Eu which is the light-emitting center will result in low brightness; and when the amount of Eu is larger than 0.025, a concentration quenching effect will occur, and the brightness will decrease with the increase in Eu, along with worsening of the temperature properties of the fluorescent powder.

In addition, a trace amount of C (carbon) is inevitable in the red light-emitting nitride material of the present disclosure. The mass percentage of C in the red light-emitting nitride material of the present disclosure is not larger than 0.1% of the total mass of the light-emitting material. Existence of the trace amount of C can stabilize the valence of the light-emitting center $Eu^{2+}$ of the light-emitting material to prevent it from converting into $Eu^{3+}$ to lower the light-emitting efficiency. However, the light-emitting material will be polluted by C having a content larger than 0.1%, which not only influences the body colour, but also greatly reduces the light efficiency.

Preferably, the red light-emitting nitride material is any one of the following materials:

$Ca_{0.99}Al_{0.9}B_{0.009}Si_{1.1}N_{3.8}O_{0.002}:Eu_{0.01},Y_{0.001}$;

$Ca_{0.2}Sr_{0.89}Al_{0.99}SiN_3O_{0.001}:Eu_{0.008},Y_{0.001},La_{0.001}$;

$Ca_{0.75}Sr_{0.22}Al_{0.92}B_{0.07}Si_{1.2}N_4O_{0.015}:Eu_{0.025},Y_{0.02},Gd_{0.005},Lu_{0.005}$;

$Ca_{0.45}Sr_{0.45}Zn_{0.02}Al_{0.9}Si_{1.48}N_4O_{0.05}:Eu_{0.04},Y_{0.015},Lu_{0.005}$;

$Sr_{1.05}Al_{0.9}B_{0.09}Si_{1.3}N_{3.5}O_{0.0005}:EU_{0.005},Y_{0.008}$;

$Ca_{0.675}Sr_{0.3}Al_{0.9}SiN_{2.6}O_{0.005}:Eu_{0.02},Gd_{0.003},La_{0.002}$;

$Sr_{1.05}Al_{0.9}B_{0.09}Si_{1.3}N_{3.5}O_{0.0005}:Eu_{0.005},Y_{0.05}$;

$Sr_{1.05}Al_{0.9}B_{0.09}Si_{1.3}N_{3.5}O_{0.0005}:Eu_{0.005},Y_{0.0008}$;

$Sr_{1.05}Al_{0.9}B_{0.09}Si_{1.3}N_{3.5}O_{0.0005}:Eu_{0.005},Y_{0.095}$; or $Ca_{0.2}Sr_{0.89}Al_{0.99}SiN_3O_{0.001}:Eu_{0.005},Y_{0.001},La_{0.001}$.

At the same time, in order to meet different application requirements, the light-emitting material involved in the present disclosure may be directly processed into a powder shape, a film shape or a sheet shape.

A method for preparing the red light-emitting nitride material of the present disclosure will be described specifically as follows:

According to the stoichiometric ratios as shown in General Formula (1), accurately weigh and then uniformly mix raw materials including a nitride of a divalent metal M, aluminum nitride, boron nitride, silicon nitride, a compound of Eu, and a compound of rare earth R etc., then calcinate the raw materials at a high temperature of 1400° C. to 1800° C. for 4 to 20 hours in a nitrogen atmosphere or a mixed atmosphere of nitrogen and hydrogen, and perform steps including crushing, screening, washing and drying etc. to a calcination product to obtain the red light-emitting material of the present disclosure.

In a typical embodiment of the present disclosure, a light-emitting part is provided. The part may be a light-emitting film, or may be also a light-emitting sheet which is formed by dispersing the red light-emitting nitride material in a glass material, a plastic material or a resin material, or uniformly dispersing the red light-emitting nitride material and other light-emitting materials together in the glass material, the plastic material or the resin material.

The light-emitting part provided by the present disclosure can be obtained by adding and uniformly mixing the red light-emitting nitride material of the present disclosure, or the red light-emitting nitride material of the present disclosure together with other light-emitting materials in a raw material of a glass material, a plastic material or a resin material in a preparation process of the glass material, the plastic material or the resin material and then preparing them into a film shape or a sheet shape according to a conventional method of the glass material, the plastic material or the resin material. The amount of the red light-emitting nitride material of the present disclosure, or the amount of a mixture of the red light-emitting nitride material of the present disclosure and other light-emitting materials is equal to the addition amount of a light-emitting material in a preparation process of a light-emitting part in the prior art. Those skilled in the art are able to prepare such a light-emitting film or light-emitting sheet provided by the present disclosure through reasonable technical means based on the present disclosure, thus manufacturing methods of the light-emitting film or light-emitting sheet will not be repeated here.

Preferably, the other light-emitting materials are one or more than one of $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, $\alpha$-SiAlON:Eu, $\beta$-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu,Cl/Al, ZnS:Ag,Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu,and $3.5MgO._{0.5}MgF_2.GeO_2$:Mn.

During a manufacturing process of the light-emitting part, the mixing ratio of the red light-emitting nitride material provided by the present disclosure and other light-emitting materials may be adjusted reasonably according to requirements of application and photochromic adjustment. Those skilled in the art are able to prepare the required light-emitting part based on the present disclosure through reasonable analysis.

In a typical embodiment of the present disclosure, a light-emitting device is further provided. The light-emitting device at least includes a radiation source, and the red light-emitting nitride material having General Formula (1) which is $M_a(Al,B)_bSi_cNO_e$:$Eu_m$,$R_n$.

The light-emitting material may be in a powder shape, a film shape or a sheet shape, or may be dispersed in a glass material, a plastic material or a resin material to prepare the light-emitting part.

The radiation source may be any radiation source that can emit a radiation light having a wavelength below 500 nm. Preferably, the radiation source is a vacuum ultraviolet emission source, an ultraviolet emission source, a purple light emission source or a blue light emission source. Excited by the vacuum ultraviolet emission source, the ultraviolet emission source, the purple light emission source or the blue light emission source respectively, all light-emitting materials involved in the present disclosure can emit efficient red lights.

Preferably, besides the red light-emitting nitride material having the structure of General Formula (1), other light-emitting materials that can be effectively excited by a corresponding radiation source may be further added in the light-emitting device, e.g. a yellow or green light-emitting material which can be excited by a blue light may be added in a combination of "a blue light LED+the light-emitting materials involved in the present disclosure" to form a white light-emitting device; a blue light-emitting material and a green light-emitting material which can be excited by vacuum ultraviolet, ultraviolet, or a purple light may be added in "a vacuum ultraviolet, ultraviolet or purple light LED+the light-emitting materials involved in the present disclosure" to form a white light-emitting device, and the like. These white light-emitting devices may be applied in the field of illumination or display.

Other light-emitting materials that can be mixed with the red light-emitting nitride material of the present disclosure in the light-emitting device mainly include: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, $\alpha$-SiAlON:Eu, $\beta$-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu,Cl/Al, ZnS:Ag,Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu, and $3.5MgO._{0.5}MgF_2.GeO_2$:Mn, etc.

The chromaticity coordinates, relative brightness and half width of the red light-emitting nitride material provided by the present disclosure will be further described in combination with specific embodiments 1 to 22 and a comparative example. At the same time, the beneficial effect of the light-emitting device provided by the present disclosure will be further described in combination with embodiment 23 to embodiment 33.

Table 1 shows the chemical formulae of the red light-emitting nitride materials in the embodiment 1 to the embodiment 22, and a pure $Ca_{0.99}AlSiN_3$:$Eu_{0.01}$ light-emitting material is selected in the comparative example.

A method for preparing the light-emitting materials in the embodiment 1 to the embodiment 22 and the comparative example:

According to the stoichiometric ratios as shown in the general formulae in the embodiment 1 to the embodiment 22, accurately weigh and then uniformly mix raw materials including a nitride of a divalent metal M, aluminum nitride, boron nitride, silicon nitride, a compound of Eu, and a compound of rare earth R etc., wherein oxygen in the components is introduced through the compound of Eu or the compound of rare earth R; then calcinate the raw materials at a high temperature of 1500° C. to 1600° C. for 6 to 8 hours in a nitrogen atmosphere or a mixed atmosphere of nitrogen and hydrogen, crush (crush to 5 to 20 microns) obtained calcination products, pass the calcination products through a 100 to 500-mesh sieve, wash the calcination products with a dilute acid, or deionized water, and dry the calcination products at 80° C. to 120° C. to obtain samples of the embodiment 1 to the embodiment 22 and chemical formulae of the comparative example.

Measurement Method:

The chromaticity coordinates, relative brightness and half widths of the red light-emitting nitride materials in the comparative example and the embodiment 1 to the embodiment 22 are measured by a spectrophotometer, wherein an excitation wavelength is set at 460 nm, and the relative brightness of the comparative example is defined as 100. The measurement results are as shown in Table 1:

TABLE 1

Chemical formulae of light-emitting materials in the comparative example and the embodiment 1 to the embodiment 22 and their photochromic properties

| | Chemical formula of light-emitting material | Chromaticity coordinate x | Chromaticity coordinate y | Relative brightness | Half width (nm) |
|---|---|---|---|---|---|
| Comparative example | $Ca_{0.99}AlSiN_3:Eu_{0.01}$ | 0.6798 | 0.3185 | 100 | 91 |
| Embodiment 1 | $Ca_{0.99}Al_{0.9}B_{0.009}Si_{1.1}N_{3.8}O_{0.002}:EU_{0.01}, Y_{0.001}$ | 0.6744 | 0.3207 | 138 | 108 |
| Embodiment 2 | $Ca_{0.2}Sr_{0.89}Al_{0.99}SiN_3O_{0.001}:Eu_{0.008}, Y_{0.001}, La_{0.001}$ | 0.6392 | 0.3595 | 195 | 105 |
| Embodiment 3 | $Ca_{0.75}Sr_{0.22}Al_{0.92}B_{0.07}Si_{1.2}N_4O_{0.015}:Eu_{0.025}, Y_{0.02}, Gd_{0.005}, Lu_{0.005}$ | 0.6571 | 0.3424 | 168 | 117 |
| Embodiment 4 | $Sr_{0.65}Mg_{0.32}Zn_{0.1}Al_{0.95}B_{0.008}SiN_{2.8}O_{0.005}:Eu_{0.03}, Y_{0.003}, La_{0.006}, Ce_{0.001}$ | 0.6312 | 0.3682 | 155 | 108 |
| Embodiment 5 | $Ca_{0.85}Zn_{0.05}Al_{0.95}Si_{1.4}N_{4.8}O_{0.095}:Eu_{0.048}, Y_{0.03}, Gd_{0.02}$ | 0.6598 | 0.3387 | 116 | 130 |
| Embodiment 6 | $Ca_{0.9}Mg_{0.085}Al_{0.92}B_{0.03}Si_{1.2}N_{4.5}O_{0.008}:Eu_{0.0001}, Y_{0.08}, Gd_{0.01}$ | 0.6672 | 0.3285 | 117 | 113 |
| Embodiment 7 | $Ca_{0.45}Sr_{0.45}Zn_{0.02}Al_{0.9}Si_{1.48}N_4O_{0.05}:Eu_{0.04}, Y_{0.015}, Lu_{0.005}$ | 0.6424 | 0.3572 | 192 | 125 |
| Embodiment 8 | $Sr_{1.05}Al_{0.9}B_{0.09}Si_{1.3}N_{3.5}O_{0.0005}:Eu_{0.005}, Y_{0.008}$ | 0.6127 | 0.3728 | 253 | 100 |
| Embodiment 9 | $Sr_{0.5}Ba_{0.2}Zn_{0.28}Al_{0.95}B_{0.001}SiN_{3.2}O_{0.0001}:Eu_{0.001}, Ce_{0.003}, Lu_{0.005}$ | 0.6281 | 0.3672 | 217 | 95 |
| Embodiment 10 | $Ca_{0.675}Sr_{0.3}Al_{0.9}SiN_{2.6}O_{0.005}:EU_{0.02}, Gd_{0.003}, La_{0.002}$ | 0.6497 | 0.3477 | 180 | 111 |
| Embodiment 11 | $Zn_{0.99}Al_{0.9}B_{0.009}Si_{1.1}N_{3.8}O_{0.002}:EU_{0.01}, Y_{0.001}$ | 0.6704 | 0.3209 | 102 | 106 |
| Embodiment 12 | $Mg_{0.85}Zn_{0.05}Al_{0.95}Si_{1.4}N_{4.8}O_{0.095}:Eu_{0.048}, Y_{0.03}, Gd_{0.02}$ | 0.6578 | 0.3382 | 107 | 116 |
| Embodiment 13 | $Mg_{0.5}Ba_{0.2}Zn_{0.28}Al_{0.95}B_{0.001}SiN_{3.2}O_{0.0001}:Eu_{0.001}, Ce_{0.003}, Lu_{0.005}$ | 0.6257 | 0.3647 | 112 | 96 |
| Embodiment 14 | $Ca_{0.675}Sr_{0.3}Al_{0.9}SiN_{2.6}O_{0.005}:EU_{0.02}, La_{0.002}$ | 0.6502 | 0.3469 | 162 | 110 |
| Embodiment 15 | $Ca_{0.75}Sr_{0.22}Al_{0.92}B_{0.07}Si_{1.2}N_4O_{0.015}:Eu_{0.025}, Ce_{0.005}, Lu_{0.005}$ | 0.6543 | 0.3437 | 138 | 119 |
| Embodiment 16 | $Sr_{1.05}Al_{0.9}B_{0.09}Si_{1.3}N_{3.5}O_{0.0005}:Eu_{0.005}, Gd_{0.008}$ | 0.6124 | 0.3729 | 223 | 101 |
| Embodiment 17 | $Sr_{1.05}Al_{0.9}B_{0.09}Si_{1.3}N_{3.5}O_{0.0005}:Eu_{0.005}, Y_{0.05}$ | 0.6119 | 0.3748 | 265 | 99 |
| Embodiment 18 | $Sr_{1.05}Al_{0.9}B_{0.09}Si_{1.3}N_{3.5}O_{0.0005}:Eu_{0.005}, Y_{0.0008}$ | 0.6131 | 0.3725 | 228 | 100 |
| Embodiment 19 | $Sr_{1.05}Al_{0.9}B_{0.09}Si_{1.3}N_{3.5}O_{0.0005}:Eu_{0.005}, Y_{0.095}$ | 0.6117 | 0.3755 | 233 | 100 |
| Embodiment 20 | $Ca_{0.2}Sr_{0.89}Al_{0.99}SiN_3O_{0.001}:Eu_{0.005}, Y_{0.001}, La_{0.001}$ | 0.6389 | 0.3602 | 188 | 105 |
| Embodiment 21 | $Ca_{0.85}Zn_{0.05}Al_{0.95}Si_{1.4}N_{4.8}O_{0.095}:Eu_{0.012}, Y_{0.03}, Gd_{0.02}$ | 0.6563 | 0.3415 | 164 | 129 |
| Embodiment 22 | $Ca_{0.9}Mg_{0.085}Al_{0.92}B_{0.03}Si_{1.2}N_{4.5}O_{0.008}:Eu_{0.025}, Y_{0.08}, Gd_{0.01}$ | 0.6695 | 0.3272 | 141 | 115 |

TABLE 2

Temperature property Data of relative brightness of light-emitting materials in the comparative example and the 1st embodiment to the 22nd embodiment

| | Room temperature | Relative brightness at different temperatures | | | Brightness maintenance rate (%) at 150° C. |
|---|---|---|---|---|---|
| | | 50° C. | 100° C. | 150° C. | |
| Comparative example | 100 | 100 | 96.0 | 89.0 | 89.0 |
| Embodiment 1 | 138 | 138 | 135.2 | 127.6 | 92.5 |
| Embodiment 2 | 195 | 195 | 192.8 | 181.1 | 92.8 |
| Embodiment 3 | 168 | 168 | 165.4 | 155.5 | 92.6 |
| Embodiment 4 | 155 | 155 | 151.9 | 145.5 | 93.9 |
| Embodiment 5 | 116 | 116 | 113.2 | 107.1 | 92.3 |
| Embodiment 6 | 117 | 117 | 114.9 | 109.4 | 93.5 |
| Embodiment 7 | 192 | 192 | 189.2 | 179.6 | 93.6 |
| Embodiment 8 | 253 | 253 | 251.3 | 237.8 | 94.0 |
| Embodiment 9 | 217 | 217 | 214.9 | 201.9 | 93.0 |
| Embodiment 10 | 180 | 180 | 177.6 | 168.2 | 93.4 |
| Embodiment 11 | 102 | 102 | 98.9 | 92.9 | 91.1 |
| Embodiment 12 | 107 | 107 | 104.0 | 97.8 | 91.4 |
| Embodiment 13 | 112 | 112 | 109.2 | 102.5 | 91.5 |

TABLE 2-continued

Temperature property Data of relative brightness of light-emitting materials in the comparative example and the 1st embodiment to the 22nd embodiment

|  | Room temperature | Relative brightness at different temperatures | | | Brightness maintenance rate (%) at 150° C. |
| --- | --- | --- | --- | --- | --- |
|  |  | 50° C. | 100° C. | 150° C. |  |
| Embodiment 14 | 162 | 162 | 158.7 | 149.8 | 92.5 |
| Embodiment 15 | 138 | 138 | 135.0 | 127.6 | 92.5 |
| Embodiment 16 | 223 | 223 | 220.4 | 209.1 | 93.8 |
| Embodiment 17 | 265 | 265 | 263.2 | 249.0 | 93.9 |
| Embodiment 18 | 228 | 228 | 225.5 | 213.9 | 93.8 |
| Embodiment 19 | 233 | 233 | 230.4 | 218.7 | 93.9 |
| Embodiment 20 | 188 | 188 | 185.5 | 175.3 | 93.3 |
| Embodiment 21 | 164 | 164 | 161.1 | 152.5 | 93.0 |
| Embodiment 22 | 141 | 141 | 137.8 | 130.2 | 92.3 |

It can be easily learned from the results of the embodiment 1 to the embodiment 22 in Table 1 that all novel red light-emitting materials involved in the present disclosure have higher brightness and wider half widths than those of the $Ca_{0.99}AlSiN_3$:$Eu_{0.01}$ light-emitting material in the comparative example, which is very beneficial to enhancing the light-emitting efficiency and colour rendering indexes of application devices. In addition, it can be learned from the temperature property data of the light-emitting materials in the embodiment 1 to the embodiment 22 in Table 2 that the brightness of the light-emitting materials involved in the embodiment 1 to the embodiment 22 at a high temperature of 150° C. is 91% to 94% of that at room temperature, which is higher than the brightness which is 89% of the $Ca_{0.99}AlSiN_3$:$Eu_{0.01}$ light-emitting material in the comparative example.

At the same time, the following phenomena can be easily found according to corresponding data in the embodiment 1 to the embodiment 22 in Table 1:

(1) When M in a light-emitting material of the present disclosure does not contain Ca or Sr, the brightness of the prepared light-emitting material is obviously low.

As shown in the embodiment 11, the embodiment 12 and the embodiment 13 in Table 1, M in the light-emitting materials in the embodiment 11, the embodiment 12 and the embodiment 13 do not contain Ca or Sr. It can be learned from the results in Table 1 that the brightness of the light-emitting materials prepared in the embodiment 11, the embodiment 12 and the embodiment 13 under three different chromaticity coordinates is obviously lower than that of the light-emitting materials prepared in other embodiments in which M contains Ca or Sr. Thus it can be learned that the light-emitting efficiency of a light-emitting material of the present disclosure is obviously improved when M contains Ca or Sr.

(2) When R in a light-emitting material of the present disclosure is rare earth element Y and/or Gd, the light-emitting material has higher brightness.

Comparing the embodiment 10 and the embodiment 14 in Table 1, component Gd is added to the light-emitting material in the embodiment 10 compared with the light-emitting material in the embodiment 14. Though having basically the same chromaticity coordinates, the brightness of the light-emitting material in the embodiment 10 is obviously higher than that of the light-emitting material in the embodiment 14.

Comparing the embodiment 3 and the embodiment 15 in Table 1, Y, Gd and Lu are applied in R of the light-emitting material in the embodiment 3 compared with the light-emitting material in the embodiment 15 while Ce and Lu are applied in R in the embodiment 15. Though having basically the same chromaticity coordinates, the brightness of the light-emitting material in the embodiment 10 is obviously higher than that of the light-emitting material in the embodiment 14.

Thus it can be learned that when R in a light-emitting material is rare earth element Y and/or Gd, the light-emitting material has higher brightness.

(3) When R in a light-emitting material of the present disclosure is rare earth element Y, the light-emitting material has higher brightness. Comparing the embodiment 8, and the embodiment 16 to the embodiment 19 in Table 1, in which R of the light-emitting material in the embodiment 16 applies Gd, while R in the light-emitting materials in the embodiment 8, the embodiment 17, the embodiment 18 and the embodiment 19 apply Y. Though having basically the same chromaticity coordinates, the brightness of the light-emitting materials in the embodiment 8, the embodiment 17, the embodiment 18 and the embodiment 19 applying Y is higher than that of the light-emitting material in the $8^{th}$ embodiment. Thus it can be learned that when R in a light-emitting material of the present disclosure is rare earth element Y, the light-emitting material has higher brightness.

(4) When the use amount n of R in a light-emitting material of the present disclosure is 0.001≤n≤0.05, the light-emitting material has higher brightness.

In order to enhance comparison, the embodiment 8, and the embodiment 17 to the embodiment 19, in which R apply Y in the light-emitting materials, are taken for example. Though having basically the same chromaticity coordinates, the brightness of the light-emitting materials in the embodiment 8 and the embodiment 17 is obviously higher than that of the light-emitting materials in the embodiment 18 and the embodiment 19. Thus it can be learned that when the use amount n of R in a light-emitting material of the present disclosure is 0.001≤n≤0.05, the light-emitting material has higher brightness.

(5) When the use amount m of Eu in a light-emitting material of the present disclosure is 0.005≤m≤0.025, the light-emitting material has higher brightness.

Comparing the embodiment 2 and the embodiment 20, the embodiment 5 and the embodiment 21, the embodiment 6 and embodiment 22 in Table 1, only the use amount m of Eu changes in the embodiment 20 relative to the embodiment 2, in the embodiment 21 relative to the embodiment 5, and in the embodiment 22 relative to the embodiment 6. It can be learned from the results in Table 1 that when the use amount m of Eu in a light-emitting material of the present disclosure is 0.001≤n≤0.05, the light-emitting material has higher brightness.

In order to further describe the beneficial effect of the light-emitting materials prepared in the present disclosure relative to the light-emitting material in the comparative example, the emission spectrum and excitation spectrum of the light-emitting material prepared in the embodiment 1 and those of the light-emitting material prepared in the comparative example are measured. Referring to FIG. 1 and FIG. 2, the abscissas are the wavelengths, the ordinates are the relative emission intensity, L1 represents the light-emitting material prepared in the embodiment 1 of the present disclosure and L2 represents the light-emitting material prepared in the comparative example in FIG. 1 and FIG. 2.

As shown in FIG. 1, the light-emitting nitride material prepared in the embodiment 1 of the present disclosure has higher emission intensity, and a wider emission range compared with that prepared in the comparative example. The half width of the light-emitting nitride material is 108 nm, which is wider than the half width which is 91 nm of the light-emitting material in the comparative example. Thus it is beneficial for improving colour rendering indexes of application devices. The relative brightness of the light-emitting nitride material prepared in the embodiment 1 and the light-emitting material prepared in the comparative example is measured by a spectral radiation analysis system. Based on the brightness of 100 in the comparative example, it is measured that the relative brightness in the embodiment 1 is 138.

As shown in FIG. 2, the excitation spectra of the light-emitting material prepared in the embodiment 1 and the light-emitting material prepared in the comparative example are in an excitation range from 250 nm to 500 nm. The light-emitting nitride material prepared in the embodiment 1 of the present disclosure has higher excitation efficiency than that of the light-emitting material prepared in the comparative example. At the same excitation wavelength, the brightness of the light-emitting material prepared in the embodiment 1 is higher than that of the light-emitting material prepared in the comparative example. At the same time, it can be easily learned from the excitation spectrum of the light-emitting material involved in the embodiment 1 that the red light-emitting nitride material has very high excitation efficiency from 250 nm to 500 nm, which indicates that this kind of light-emitting material may be combined with an ultraviolet radiation source, a purple light radiation source or a blue light radiation source to manufacture a light-emitting device.

The beneficial effect of light-emitting materials provided by the present disclosure in preparing light-emitting devices will be further described according to the embodiment 23 to the embodiment 33.

Embodiment 23

Disperse the red light-emitting material obtain in the embodiment 1 in an organic silicone resin having a refractive index of 1.4, stir uniformly to form a slurry, dispense and cure the slurry on a 410 nm purple light LED chip, weld circuits, and seal with a resin to obtain a red light-emitting device having chromaticity coordinates of (0.6727, 0.3214).

Embodiment 24

According to a proportion of 1:6, disperse the red light-emitting material obtained in the embodiment 17 and a $Y_3Al_5O_{12}$:Ce yellow light-emitting material in an organic silicone resin having a refractive index of 1.53, stir uniformly to form a slurry, coat and cure the slurry on a 460 nm blue light LED chip, weld circuits, and seal with a resin to obtain a white light-emitting device having chromaticity coordinates of (0.4417, 0.3905), a colour rendering index of 85 and a relative colour temperature of 2809 K.

Embodiment 25

According to a proportion of 1:10, disperse the red light-emitting material obtained in the embodiment 2 and a (Mg,Ca,Sr,Ba)$_2$SiO$_4$:Eu yellow light-emitting material in an organic silicone resin having a refractive index of 1.52, stir uniformly to form a slurry, coat and cure the slurry on a 455 nm blue light LED chip, weld circuits, and seal with a resin to obtain a white light-emitting device having chromaticity coordinates of (0.4228,0.3943), a colour rendering index of 82 and a relative colour temperature of 3173 K.

Embodiment 26

According to a proportion of 1:12, disperse the red light-emitting material obtained in the embodiment 9 and an α-SiAlON:Eu yellow light-emitting material in an epoxy resin having a refractive index of 1.51, stir uniformly to form a slurry, coat and cure the slurry on a 450 nm blue light LED chip, weld circuits, and seal with a resin to obtain a white light-emitting device having chromaticity coordinates of (0.3902,0.3520), a colour rendering index of 76 and a relative colour temperature of 3518 K.

Embodiment 27

According to a proportion of 1:8, disperse the red light-emitting material obtained in the embodiment 6 and a $Ba_3Si_6O_{12}N_2$:Eu green light-emitting material in an epoxy resin having a refractive index of 1.52, stir uniformly to form a slurry, coat and cure the slurry on a 452.5 nm blue light LED chip, weld circuits, and seal with a resin to obtain a white light-emitting device having chromaticity coordinates of (0.3728,0.3336), a colour rendering index of 90.6 and a relative colour temperature of 3859 K.

Embodiment 28

According to a proportion of 1:5, disperse the red light-emitting material obtained in the embodiment 3 and a (Sr,Ba)$_2$SiO$_4$:Eu green light-emitting material in an organic silicone resin having a refractive index of 1.52, stir uniformly to form a slurry, coat and cure the slurry on a 460 nm blue light LED chip, weld circuits, and seal with a resin to obtain a white light-emitting device having chromaticity coordinates of (0.4306,0.3804), a colour rendering index of 86 and a relative colour temperature of 2907 K.

Embodiment 29

According to a proportion of 1:4, disperse the red light-emitting material obtained in the embodiment 8 and a (Y,Lu)$_3$(Al,Ga)$_5$O$_{12}$:Ce green light-emitting material in an epoxy resin having a refractive index of 1.52, stir uniformly to form a slurry, coat and cure the slurry on a 455 nm blue light LED chip, weld circuits, and seal with a resin to obtain a white light-emitting device having chromaticity coordinates of (0.4377,0.3691), a colour rendering index of 89 and a relative colour temperature of 2685 K.

Embodiment 30

According to a proportion of 1:5:3, disperse the red light-emitting material obtained in the embodiment 7, a β-SiAlON:Eu green light-emitting material and a $Sr_5(PO_4)_3Cl$:Eu blue light-emitting material in an organic silicone resin having a refractive index of 1.52, stir uniformly to form a slurry, coat and cure the slurry on a 380 nm near ultraviolet LED chip, weld circuits, and seal with a resin to obtain a white light-emitting device having chromaticity coordinates of (0.3832, 0.3505), a colour rendering index of 89.7 and a relative colour temperature of 3698 K.

Embodiment 31

According to a proportion of 1:6:2, disperse the red light-emitting material obtained in the embodiment 14, a Ca$_3$(Sc, Mg)$_2$Si$_3$O$_{12}$:Ce green light-emitting material and a BaMgAl$_{10}$O$_{17}$:Eu blue light-emitting material in an organic silicone resin having a refractive index of 1.46, stir uniformly to form a slurry, coat and cure the slurry on a 360 nm ultraviolet LED chip, weld circuits, and seal with a resin to obtain a white light-emitting device having chromaticity coordinates of (0.3571,0.3002), a colour rendering index of 82.7 and a relative colour temperature of 4123 K.

Embodiment 32

Perform slurry conditioning and rolling for the red light-emitting material obtained in the embodiment 20, a Zn$_2$SiO$_4$:Mn green light-emitting material and a BaMgA$_{110}$O$_{17}$:Eu blue light-emitting material respectively, and uniformly coat the light-emitting materials in a barrier rib groove of a substrate behind a Plasma Display Panel (PDP) using screen printing, then perform screen baking for the printed substrate at low temperature, seal the substrate, introduce a Ne—Xe mixed inert gas, and weld circuits to make a colour plasma light-emitting device having chromaticity coordinates of (0.3211,0.3308) and a brightness of 864 cd/m$^2$.

Embodiment 33

Uniformly mix the red light-emitting material obtained in the embodiment 2 and (Y,Gd)BO$_3$:Eu red powder, and perform slurry conditioning and rolling for the mixture, a (Zn$_2$SiO$_4$:Mn+(Y,Lu)$_3$A$_{15}$O$_{12}$:Ce)-mixed green light-emitting material and a BaMgA$_{110}$O$_7$:Eu blue light-emitting material, uniformly coat the light-emitting materials in a barrier rib groove of a substrate behind a PDP using screen printing, then perform screen baking for the printed substrate at low temperature, seal the substrate, introduce a Ne—Xe mixed inert gas, and weld circuits to make a colour plasma light-emitting device having chromaticity coordinates of (0.3340,0.3264) and a brightness of 788 cd/m$^2$.

It can be learned from the light-emitting devices prepared in the embodiment 23 to the embodiment 31, and the colour plasma light-emitting devices prepared in the embodiment 32 and the embodiment 33 that a red light-emitting nitride material provided by the present disclosure can satisfy excitation requirements of an ultraviolet radiation source, a purple light radiation source or a blue light radiation source having different wavelengths, thus the red light-emitting nitride material may be used in combination with the radiation sources to make light-emitting devices having different chromaticity parameters. It can be learned from the data in the embodiment 23 to the embodiment 31 that the red light-emitting nitride material provided by the present disclosure may be combined with a radiation source and light-emitting materials with other light-emitting colours to make low colour temperature, high-colour rendering index white light LED devices having a colour temperature lower than 4000 K, a colour rendering index larger than 80.

Embodiments 23 to 33 are only embodiments of the present disclosure, and cannot limit the protection scope of the present disclosure. A light-emitting material in a light-emitting device protected by the present disclosure may be mixed with a glass material, a plastic material or a resin material to form a light-emitting element to further realize light emission. The glass material, plastic material and resin material in the present disclosure are optional, as long as there is no chemical reaction with the light-emitting material, and as long as the light-emitting material can still be effectively excited by an ultraviolet, purple light or blue light radiation source to emit a light after being dispersed in the glass material, plastic material and resin material.

The above are only preferred embodiments of the present disclosure and should not be used for limiting the present disclosure. For those skilled in the art, the present disclosure may have various modifications and changes. Any modifications, equivalent replacements, improvements and the like within the spirit and principle of the present disclosure shall fall within the scope of protection of the present disclosure.

What is claimed is:

1. A red light-emitting nitride material, wherein the red light-emitting nitride material is provided with the structure in General Formula (1); the General Formula (1) is M$_a$(Al,B)$_b$Si$_c$N$_d$O$_e$:Eu$_m$, R$_n$, wherein
    M is at least one of Mg, Ca, Sr, Ba and Zn;
    R is at least one of earth metal elements Y and Gd; and
    the molar ratio x of elements B and Al satisfies $0 \leq x \leq 0.1$, and $0.9 \leq a < 1.1$, $0.9 \leq b \leq 1$, $1 \leq c \leq 1.5$, $2.5 < d < 5$, $0 < e < 0.1$, $0 < m < 0.05$, $0 < n < 0.1$ and $1 < c/b < 1.5$.

2. The red light-emitting nitride material according to claim 1, wherein M at least contains Ca and/or Sr.

3. The red light-emitting nitride material according to claim 1, wherein R is earth metal element Y.

4. The red light-emitting nitride material according to claim 1, wherein the range of n is $0.001 \leq n \leq 0.05$.

5. The red light-emitting nitride material according to claim 1, wherein the range of m is $0.005 \leq m \leq 0.025$.

6. The red light-emitting nitride material according to claim 1, wherein the light-emitting material is any one of the following materials:
    Ca$_{0.99}$Al$_{0.9}$B$_{0.009}$Si$_{1.1}$N$_{3.8}$O$_{0.002}$:Eu$_{0.01}$,Y$_{0.001}$;
    Ca$_{0.2}$Sr$_{0.89}$Al$_{0.99}$SiN$_3$O$_{0.001}$:Eu$_{0.008}$,Y$_{0.001}$,La$_{0.001}$;
    Ca$_{0.75}$Sr$_{0.22}$Al$_{0.92}$B$_{0.07}$Si$_{1.2}$N$_4$O$_{0.015}$:Eu$_{0.025}$,Y$_{0.02}$,Gd$_{0.005}$,Lu$_{0.005}$;
    Ca$_{0.45}$Sr$_{0.45}$Zn$_{0.02}$Al$_{0.9}$Si$_{1.48}$N$_4$O$_{0.05}$:Eu$_{0.04}$,Y$_{0.015}$,Lu$_{0.005}$;
    Sr$_{1.05}$Al$_{0.9}$B$_{0.09}$Si$_{1.3}$N$_{3.5}$O$_{0.0005}$:EU$_{0.005}$,Y$_{0.008}$;
    Ca$_{0.675}$Sr$_{0.3}$Al$_{0.9}$SiN$_{2.6}$O$_{0.005}$:Eu$_{0.02}$,Gd$_{0.003}$,La$_{0.002}$;
    Sr$_{1.05}$Al$_{0.9}$B$_{0.09}$Si$_{1.3}$N$_{3.5}$O$_{0.0005}$:Eu$_{0.005}$,Y$_{0.05}$;
    Sr$_{1.05}$Al$_{0.9}$B$_{0.09}$Si$_{1.3}$N$_{3.5}$O$_{0.0005}$:Eu$_{0.005}$,Y$_{0.0008}$;
    Sr$_{1.05}$Al$_{0.9}$B$_{0.09}$Si$_{1.3}$N$_{3.5}$O$_{0.0005}$:Eu$_{0.005}$,Y$_{0.095}$; or
    Ca$_{0.2}$Sr$_{0.89}$Al$_{0.99}$SiN$_3$O$_{0.001}$:Eu$_{0.005}$,Y$_{0.001}$,La$_{0.001}$.

7. The red light-emitting nitride material according to claim 1, wherein the light-emitting material is powder-shaped, or film-shaped or sheet-shaped.

8. A light-emitting part, wherein the light-emitting part is formed by dispersing the red light-emitting nitride material according to claim 1 in a glass material, a plastic material or a resin material, or by dispersing the red light-emitting nitride material according to claim 1 and other light-emitting materials together in the glass material, the plastic material or the resin material.

9. A light-emitting device, wherein the light-emitting device at least includes a radiation source and the red light-emitting nitride material according to claim 1.

10. The red light-emitting nitride material according to claim 1, wherein R is earth metal element Y.

11. The red light-emitting nitride material according to claim 1, wherein the range of n is $0.001 \leq n \leq 0.05$.

12. The red light-emitting nitride material according to claim 2, wherein R at least contains earth metal element Y and/or Gd.

13. The red light-emitting nitride material according to claim 2, wherein R is earth metal element Y.

14. The red light-emitting nitride material according to claim 2, wherein the range of n is $0.001 \leq n \leq 0.05$.

15. The red light-emitting nitride material according to claim 2, wherein the range of m is 0.005≤m≤0.025.

16. The light-emitting part according to claim 8, wherein the other light-emitting materials are one or more of the following fluorescent powder: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, α-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu,Cl/Al, ZnS:Ag,Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, (Sr,Ca)S:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu,and $3.5MgO·_{0.5}MgF_2·GeO_2$:Mn.

17. The light-emitting device according to claim 9, wherein the radiation source is a vacuum ultraviolet emission source, an ultraviolet emission source, a purple light emission source or a blue light emission source.

18. The light-emitting device according to claim 9, wherein the light-emitting device further contains other light-emitting materials excited by the radiation source to emit lights.

19. The light-emitting device according to claim 18, wherein the other light-emitting materials are one or more of the following fluorescent powder: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, α-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu,Cl/Al, ZnS:Ag,Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, (Sr,Ca)S:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu,and $3.5MgO·_{0.5}MgF_2·GeO_2$:Mn.

* * * * *